(12) United States Patent
Browne et al.

(10) Patent No.: US 10,712,355 B2
(45) Date of Patent: Jul. 14, 2020

(54) HIGH RESOLUTION SURFACE PARTICLE DETECTOR

(71) Applicant: Pentagon Technologies Group, Inc., Hayward, CA (US)

(72) Inventors: David Browne, Pleasanton, CA (US); Don Lutz, Peoria, AZ (US)

(73) Assignee: PENTAGON TECHNOLOGIES GROUP, INC., Hayward, CA (US)

(*) Notice: Subject to any disclaimer, the term of this patent is extended or adjusted under 35 U.S.C. 154(b) by 78 days.

(21) Appl. No.: 16/000,499

(22) Filed: Jun. 5, 2018

(65) Prior Publication Data

US 2018/0364266 A1 Dec. 20, 2018

Related U.S. Application Data

(60) Provisional application No. 62/522,611, filed on Jun. 20, 2017.

(51) Int. Cl.
*G01N 35/00* (2006.01)
*G01N 15/02* (2006.01)
(Continued)

(52) U.S. Cl.
CPC ... *G01N 35/00732* (2013.01); *G01N 15/0205* (2013.01); *G01N 15/065* (2013.01); *H01L 21/67253* (2013.01); *G01N 2015/0046* (2013.01); *G01N 2015/0693* (2013.01); *G01N 2015/1486* (2013.01)

(58) Field of Classification Search
CPC ............. G01N 35/00732; G01N 15/06; G01N 15/065; G01N 15/0612; G01N 15/0205; G01N 2015/0046; G01N 2015/0693; G01N 2015/1486; G01N 2015/0019; G01N 1/00; G01N 1/22; G01N 1/02; G01N 1/2205; G01N 2001/028; H01L 21/67253
USPC ..... 73/864.33, 864.71, 861.41, 29.05, 31.05, 73/54.07, 61.64
See application file for complete search history.

(56) References Cited

U.S. PATENT DOCUMENTS 4,746,215 A 5/1988 Gross
5,253,538 A 10/1993 Swick
(Continued)

FOREIGN PATENT DOCUMENTS

CN 205317863 U 6/2016
CN 106769707 5/2017

*Primary Examiner* — Suman K Nath
(74) *Attorney, Agent, or Firm* — DLA Piper LLP (US)

(57) ABSTRACT

A particle counting device includes a scanner probe having a first opening for receiving particles from a sample surface and second openings. Pumps produce a first airstream flowing from the first opening and a second airstream flowing to the second openings. A flow device splits the first airstream into third and fourth airstreams. A first particle detector detects particles in the third airstream. The first particle detector is capable of detecting particles within a first range of particle sizes. A second particle detector detects particles in the fourth airstream. The second particle detector is capable of detecting particles within a second range of particle sizes different from the first range of particle sizes. Control circuitry controls the flow device and the pumps to provide a first flow rate of the third airstream and a second flow rate of the fourth airstream that is larger than the first flow rate.

19 Claims, 5 Drawing Sheets

(51) Int. Cl.
  *H01L 21/67* (2006.01)
  *G01N 15/06* (2006.01)
  *G01N 15/14* (2006.01)
  *G01N 15/00* (2006.01)

(56) References Cited

U.S. PATENT DOCUMENTS

| | | |
|---|---|---|
| 7,010,991 B2 | 3/2006 | Lutz et al. |
| 8,875,589 B1 * | 11/2014 | Mancinho .............. G01N 15/08 73/31.07 |
| 2006/0263925 A1 | 11/2006 | Chandler |
| 2009/0051908 A1 | 2/2009 | Pochy |
| 2011/0048143 A1 | 3/2011 | Favre |
| 2011/0186436 A1 | 8/2011 | Novosselov et al. |
| 2012/0222495 A1 | 9/2012 | Bates |
| 2013/0213115 A1 | 8/2013 | Chu et al. |

* cited by examiner

HIGH RESOLUTION SURFACE PARTICLE DETECTOR

RELATED APPLICATIONS

This application claims the benefit of U.S. Provisional Application No. 62/522,611, filed Jun. 20, 2017, and which is incorporated herein by reference.

FIELD OF THE INVENTION

The present invention relates generally to particle counting for clean room applications, and relates more particularly to an improved device for moving particles off of a surface and into a particle counter for the purpose of ascertaining contamination levels of small particles.

BACKGROUND OF THE INVENTION

Contamination detection and quantification requirements have become increasingly important, particularly with the rapid evolution of high-tech industries. For example, the semiconductor industry has developed technology for precisely producing microelectronic devices. In order to reliably produce such products, highly stringent contamination standards must be maintained in the production facilities.

In an effort to control and minimize contamination in crucial stages of a production process, "cleanrooms" are frequently used. A cleanroom is a room in which the air filtration, air distribution, utilities, materials of construction, equipment, and operating procedures are specified and regulated to control airborne particle concentrations to meet appropriate airborne particulate cleanliness classifications.

It is important to monitor the cleanliness/contamination levels in a cleanroom, especially for detecting particles on a cleanroom surface. Visual inspection techniques have been used with ultraviolet or oblique white light. Ultraviolet light is employed to take advantage of the fact that certain organic particles fluoresce. Alternatively, white light is shined towards the test surface at an angle so as to produce reflections that can be visualized. While the white light technique is slightly more sensitive than the ultraviolet technique, they both suffer from the same limitations. These visual inspection techniques only allow a cursory inspection of the surface conditions. They do not provide quantitative data. Also, the visual inspection techniques, at best, only detect particles that are larger than twenty microns. It is often desirable to detect particles that are less than one micron.

Another inspection technique involves removing particles from a test surface, by for example, applying a piece of adhesive tape to the test surface. The particles on the tape are then manually quantified by putting the tape under a microscope and visually counting the particles. This technique allows the detection of particles of approximately five microns or larger. The primary disadvantage of this technique is that it is very time consuming, and that it is highly sensitive to variability between operators.

A third inspection technique is disclosed in U.S. Pat. No. 5,253,538. The '538 patent discloses a device that includes a scanner probe having at least one opening for receiving particles from the sample surface. The scanner probe is connected to a tube having first and second ends. The first end of the tube is connected to the scanner probe and the second end of the tube is connected to a particle counter that employs optical laser technology. The particle counter includes a vacuum generator that causes air to flow from the sample surface through the scanner probe, through the tube and into the particle counter, where particles contained in the airstream are counted. The '538 patent discloses an inspection method that involves the use of the particle counting device. A background particle level of zero is first established by holding the scanner probe near the cleanroom supply air and taking repeated readings, or by installing an optional zero-count filter in the particle counter. Next, the hand-held scanner probe is passed over the sample surface at a constant rate for a predetermined test period. The test cycle is started by pushing the run switch, which is located on the scanner probe. The particle counter counts and reads out a number corresponding to the average number of particles per unit area. The process is usually repeated several times along adjacent surface areas, each time yielding a "test reading".

An improvement of the technique disclosed in the '538 patent is one disclosed in U.S. Pat. No. 7,010,991, which is incorporated herein by reference for all purposes. The '991 patent describes a device for counting particles on a sample surface. The device includes a scanner probe having at least one opening for receiving particles from a sample surface, a particle counter for counting particles passed there through, a conduit having a first end connected to the scanner probe and a second end connected to the particle counter, wherein the conduit includes first and second tubes, a sensor and a controller. The particle counter includes a pump for producing an airstream flowing from the scanner probe opening, through the first tube, through the particle counter, and back to the scanner probe via the second tube, for carrying the particles to the particle counter for quantitation. The sensor measures a rate of flow of the airstream. The controller controls a speed of the pump in response to the measured rate of flow of the airstream to maintain the airstream at a constant flow rate while the particle counter quantitates the particles in the airstream.

The '991 patent further describes a device including a scanner probe having at least one opening for receiving particles from a sample surface, a conduit having a first end connected to the scanner probe and a second end terminating in a first connector, wherein the conduit includes first and second tubes, a particle counter, electronic indicia, and a controller. The particle counter counts particles passed there through, and includes a port for receiving the first connector and a pump for producing an airstream flowing from the scanner probe opening, through the first tube, through the particle counter, and back to the scanner probe via the second tube, for carrying the particles to the particle counter for quantitation. The electronic indicia is disposed in at least one of the first connector, the conduit and the scanner probe for identifying at least one characteristic of the scanner probe. The controller detects the electronic indicia via the port and first connector, and controls the particle counter in response to the detected electronic indicia.

The '991 patent further describes a device including a scanner probe having at least one opening for receiving particles from a sample surface, a particle counter for analyzing particles passed there through, and a conduit having a first end connected to the scanner probe and a second end connected to the particle counter. The conduit includes first and second tubes. The particle counter includes a pump for producing an airstream flowing from the scanner probe opening, through the first tube, through the particle counter, and back to the scanner probe via the second tube, for carrying the particles to the particle counter. The particle counter also includes a particle detector for counting the particles in the airstream coming from the scanner probe, a filter cartridge port through which the airstream flows after passing through the particle detector, and a filter cartridge removably connected to the filter cartridge port for capturing the particles in the airstream after being counted by the particle detector.

With the particle counting device configurations described above with respect to the '991 patent, it is known to use an optical sensor as the particle counter. The optical sensor employs optical laser technology that is capable of receiving the entire air flow from the scanner probe, and detecting/counting particles in that air flow for particles having sizes in the size range of 300 nm to 10,000 nm or even larger. However, as the semiconductor industry continues to scale down the critical dimensions in produced products, there is a need for detecting particles with sizes less than 300 nm as well.

BRIEF SUMMARY OF THE INVENTION

The aforementioned problems and needs are addressed by a device for counting particles on a sample surface that includes a scanner probe having a first opening for receiving particles from a sample surface and one or more second openings, one or more pumps for producing a first airstream flowing from the first opening and a second airstream flowing to the one or more second openings, a flow device for splitting the first airstream into a third airstream and a fourth airstream, a first particle detector for receiving and detecting particles in the third airstream, wherein the first particle detector is capable of detecting particles within a first range of particle sizes, a second particle detector for receiving and detecting particles in the fourth airstream, wherein the second particle detector is capable of detecting particles within a second range of particle sizes which is different from the first range of particle sizes, and control circuitry for controlling the flow device and the one or more pumps to provide a first flow rate of the third airstream and a second flow rate of the fourth airstream, wherein the first flow rate is smaller than the second flow rate.

A device for counting particles on a sample surface includes a scanner probe having a first opening for receiving particles from a sample surface and one or more second openings, one or more pumps for producing a first airstream flowing from the first opening and a second airstream flowing to the one or more second openings, a flow device for splitting the first airstream into a third airstream and a fourth airstream, a particle detector for receiving and detecting particles in the third airstream, and control circuitry for controlling the flow device and the one or more pumps to provide a first flow rate of the third airstream and a second flow rate of the fourth airstream.

Other objects and features of the present invention will become apparent by a review of the specification, claims and appended figures.

DETAILED DESCRIPTION OF THE INVENTION

As the technology industries such as semiconductor logic and memory, display, disk drive, and others move to smaller and smaller geometries, understanding and controlling the particle levels on surfaces that the product is exposed to during fabrication become critical to the success and yield of their manufacturing processes. Current fabrication is occurring at the 14 nm node with continual advancements to smaller geometries. The present invention provides surface particle data at the 10 nm and above level, which is superior to conventional surface particle detection systems, which are only capable of 100 nm and above sensitivity.

Figure 1:
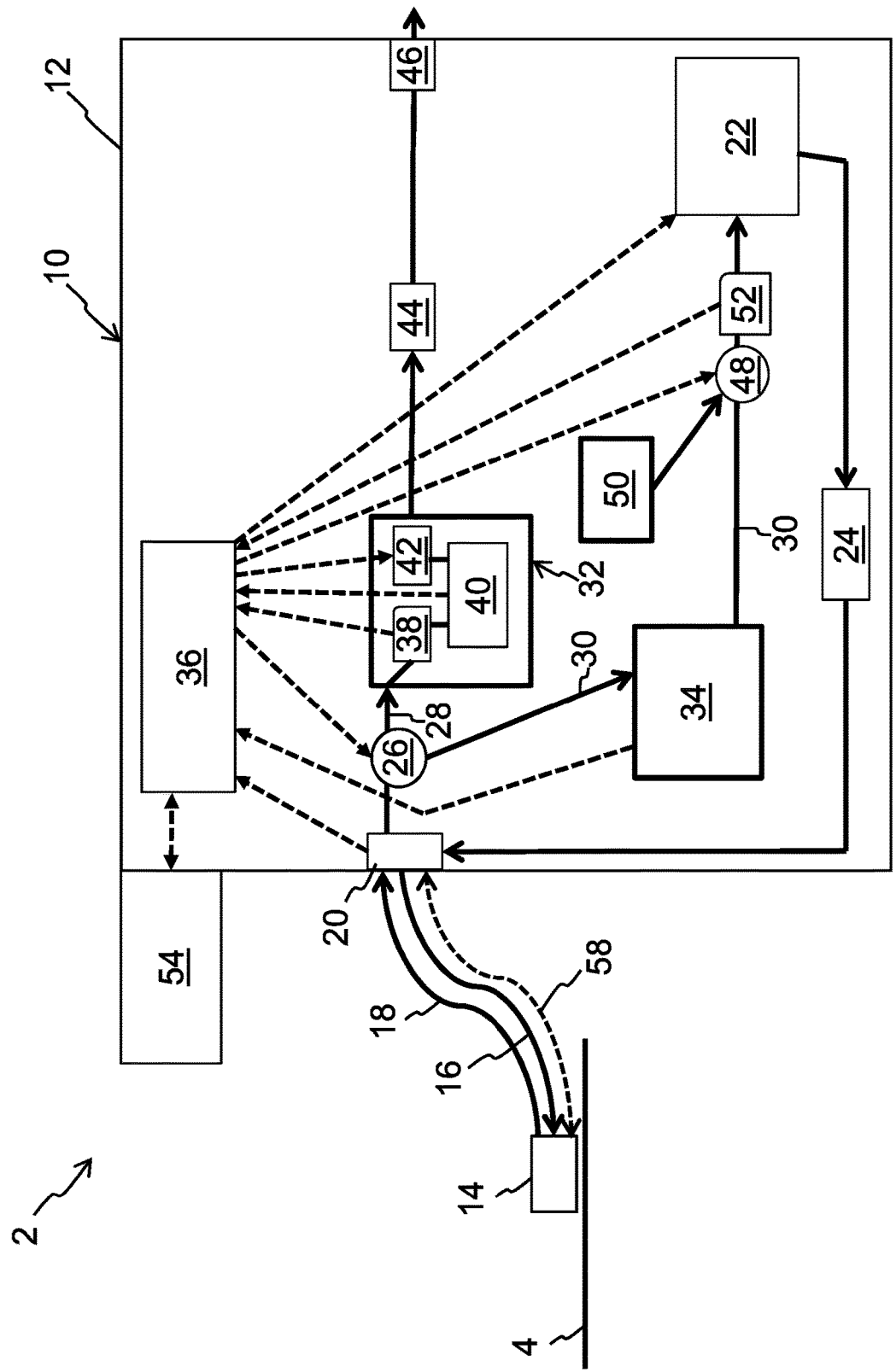
FIG. 1 is a diagram illustrating the components of a first embodiment of the particle detector system.

The present invention is an improvement over the previously described scanner probe devices. The particle detector system 2 includes a main unit 10 with a housing 12 connected to a scanner probe 14 by supply and return tubes 16 and 18 respectively, as shown in FIG. 1. Preferably, the supply/return tubes 16/18 are removably connected to the probe 14 and/or a probe interface 20 of the main unit 10. The system's probe 14 is held on or near the surface 4 being tested, where supply air provided by a supply tube 16 dislodges and fluidizes the particles on the surface. A vacuum in return tube 18 transports the sample air including the fluidized particles to the main unit 10 for counting the particles.

As shown in FIG. 1, inside the housing 12 of the main unit 10, a main pump 22 provides a source of supply air at a constant rate (e.g. 1.1 cubic feet per minute—CFM). The supply airstream travels through a filter 24, through the probe interface 20, through the supply tube 16, and to the probe 14. The probe 14 directs the supply air onto the test surface 4 to dislodge and suspend particles that are on the test surface. The scanner probe 14, its interconnections, and its automatic detection are described in further detail below. Air from the tested surface (i.e., the sample airstream which includes the dislodged particles) are drawn through the return tube 18, through the probe interface 20 and to a flow device 26. The sample airstream preferably includes the same flow rate (1.1 CFM) as the supply airstream.

Flow device 26 is an active flow splitter that splits the sample airstream into airstreams 28 and 30 with fixed air flow rates respectively. The airstream 28 has a relatively low air flow rate (e.g. 0.1 CFM) and is directed to a high resolution detector 32. The airstream 30 has a relatively high air flow rate (e.g., 1.0 CFM) and is directed to a low resolution detector 34. Flow device 26 is operated under the control of a control circuitry in a controller 36 to maintain the proper split flow ratio between the airstreams 28/30.

The high resolution detector 32 preferably includes a flow sensor 38 which measures the flow rate of the airstream 28 through detector 32, and provides its output signal to the controller 36. It should be noted that, in the figures, electrical wire connections are generally shown as dotted lines, and tubing that routes air flow are generally shown as solid lines with an arrow indicating the airflow direction. The airstream exiting the flow sensor 38 passes through a detector 40, which detects and measures the number of particles in the airstream. Preferably, the detector 32 includes a pump 42 to assist in the flow of the airstream through detector 40. Pump 42 is operated under the control of the controller 36 to maintain the proper flow rate of the airstream. The airstream exiting pump 42 passes through an optional filter 44, and then is discharged from the unit through an output port 46.

One example of detector 40 is a condensation particle counter (CPC), which includes a special fluid and a laser optics sensor. The special liquid, which can be water or alcohol based, is vaporized and condenses on any particles in the airstream, which "grows" the particles to a size that can be counted with laser optics technology (i.e. the combination of the vaporized fluid particles condensed onto the particles make the combination large enough to detect using a laser optics sensor). The detector 40 is capable of detecting/measuring particles with sizes of 10 nm to 1000 nm. Because of its higher resolution measurement technique, it can only process a low rate of air flow (e.g. 0.1 CFM). The output signal of high resolution detector 32 is provided to the controller 36.

The low resolution detector 34 is a conventional optical detector that detects/measures the number of particles in the airstream 30. The low resolution detector 34 is preferably a conventional optical laser based detector, and is capable of detecting/measuring particles with sizes as small as 300 nm and as large as 10,000 nm or larger. This lower resolution measurement technique can process a higher rate of air flow (e.g., 1.0 CFM). The output signal of low resolution detector 34 is provided to the controller 36.

The airstream 30 leaving low resolution detector 34 is provided to flow device 48, which adds an air flow (e.g., 0.1 CFM) from an air source 50 (e.g., an air input port) to the airstream (to boost the flow of air in the airstream back to the original flow rate of the supply air steam from the probe 14—to compensate for the portion of the airstream diverted to the detector 32). Flow sensor 52 can be used to measure, control and verify the proper amount of air flow in the airstream after the flow device 48. The airstream is then provided to the main pump 22, where it is driven back through the filter 24 (which removes all the particles from the airstream), and back to the probe 14 via supply tube 16 as supply air to dislodge additional particles for extraction, detection and measurement.

The controller 36 actively operates the flow devices 26 and 48, and pumps 22 and 42, to maintain the desired flow rates through the high and low resolution detectors 32 and 34. The controller 36, knowing the relative flow rates through each detector, and the number of particles detected by each detector, calculates the total number of particles present in the sample airstream entering the probe interface 20 from the probe 14. These calculations take into account that the particle detection results from the high resolution detector 32 were from a relatively small portion of the total air flow from the probe 14, and the particle detection results from the low resolution detector 34 were from a relatively high portion of the total air flow from the probe 14. For example, the corrected particle count for the high resolution detector 32 (corrected for flow through the detector 32) is the actual number of particles detected by detector 32 multiplied by the ratio of the total air flow over the actual flow just through detector 32:

Corrected Particle Count for Detector 32:

$$\text{(actual particle count by detector 32)} \times \left( \frac{\text{total air flow}}{\text{detector 32 air flow}} \right)$$

Similarly, the corrected particle count for the low resolution detector 34 (corrected for flow through the detector 34) is the actual number of particles detected by the detector 34 multiplied by the ratio of the total air flow over the actual flow through the detector 34:

Corrected Particle Count for Detector 34:

$$\text{(actual particle count by detector 34)} \times \left( \frac{\text{total air flow}}{\text{detector 34 air flow}} \right)$$

The total particle count for the particles in the sample airstream is the sum of the corrected particle count for detector 32 and the corrected particle count for detector 34:

Total particle count=(corrected particle count for detector 32)+(corrected particle count for detector 34)

Particles per square area of the surface being scanned can be calculated by dividing the total corrected particle count by the area of the probe (if stationary), or by the total area of the surface covered by the probe (if moving).

Different scanner probes can have different rated flow rates for extracting particles from the test surface. The user can input the probe type using a user interface 54, or the controller can automatically detect the type of probe being attached to the probe interface, as explained in more detail below. The controller 36 will then automatically drive the pumps 22 and 42, and flow devices 26 and 48, to provide the ideal rate of the sample flow stream to the probe 14, and the desired air flow rates of the airstreams 28 and 30 to the two detectors 32 and 34 so they operate within their specified air flow rates. The controller 36 then calculates the total particles in the sample airstream based upon the partial stream particle detections by detectors 32 and 34. For example, the probe 14 in FIG. 1 operates with a supply air flow and sample air flow of 1.1 CFM, where the sample air flow is split into two airstreams by flow device 26 of 0.1 CFM (for airstream 28 going to the detector 32) and of 1.0 CFM (for airstream 30 going to the detector 34). However, a different probe could have a rated flow rate of 0.8 CFM. In that case, the controller 36 would run the system with a supply air flow and sample air flow both having a flow rate of 0.8 CFM, where the sample air flow is split into two airstreams by flow device 26 of 0.1 CFM (for airstream 28 going to the detector 32) and 0.7 CFM (for airstream 30 going to the detector 34). Thus, no matter what probe is used, the flow rate of air through the detector 32 will not exceed is maximum rated flow rate, yet different probes will operate at their rated flow rate, and the system will accurately and automatically determine the total number of particles in the sample airstream.

The user interface 54 can include a touchscreen to allow the user to set up the system, and provide the user operating and diagnostic data along with particle count results and other critical information. The data will be stored for downloading through a USB, Bluetooth, or Ethernet connection. Measurement data can be expressed in several ways such as particles per area of the probe face, particles per length of sample time, or particles per sample.

Figure 2:
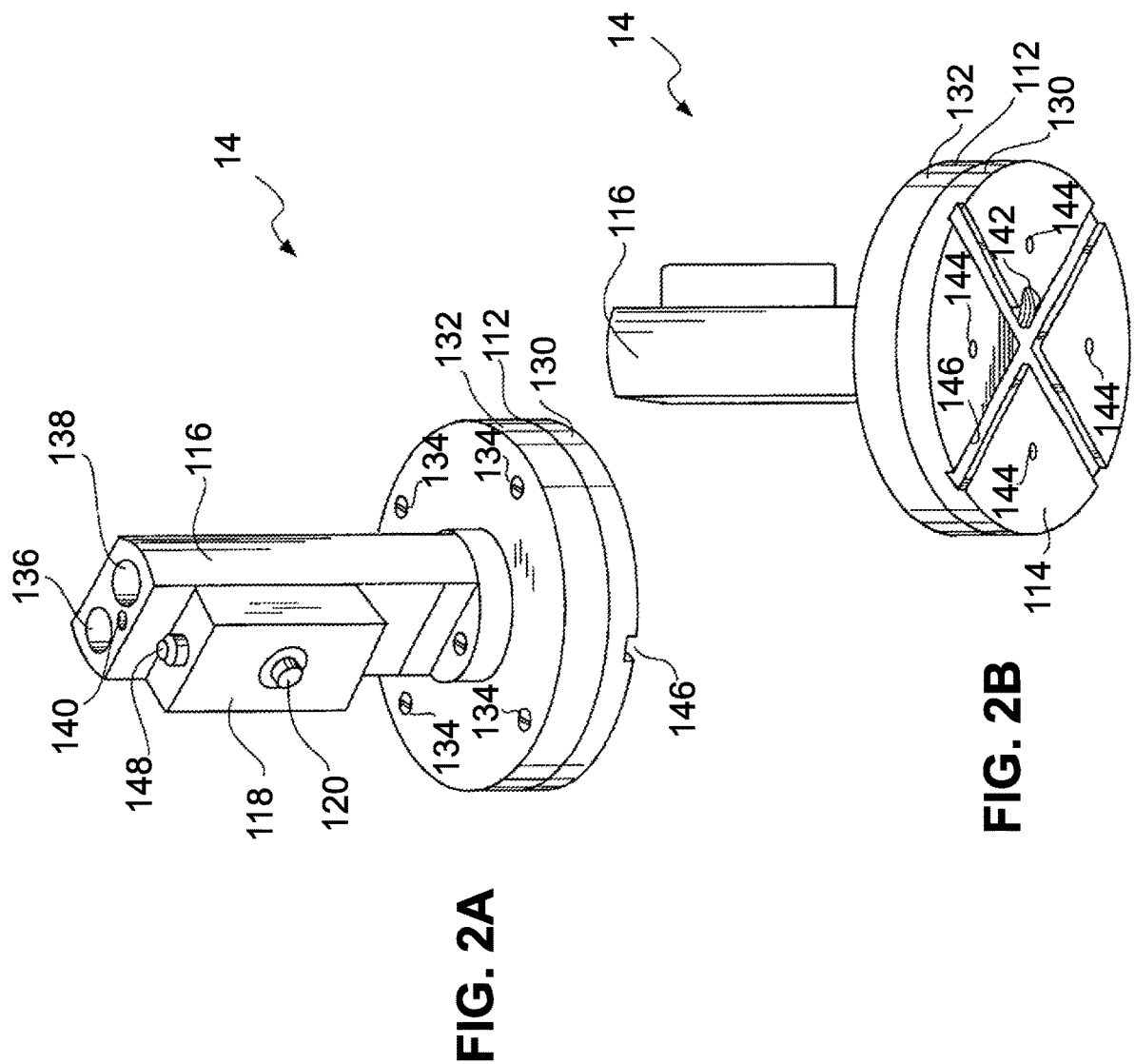
FIG. 2A is a top perspective view of the scanner probe.
FIG. 2B is a bottom perspective view of the scanner probe.

FIGS. 2A and 2B illustrate the scanner probe 14, which includes a substantially planar base 112. The scanner base 112 has a bottom side 114 for interfacing with the sample surface. The scanner base 112 is perpendicularly connected to a scanner handle 116 which includes a control section 118 having run switch 120 for activating the particle detector and an LED light 148 indicating that particle counting is in progress. Conduit connected between the scanner handle 116 and the probe interface 20 includes supply and return tubes 16/18 and electrical wiring 58 which electrically connects the probe 14 to the main unit 10. The probe or its associated electrical wiring (or electrical connections relating thereto) can include electronic indicia that identifies the type or configuration of the probe 14. The controller 36 can detect this electronic indicia to identify the type/configuration of the probe 14 attached to the main unit 10, and operate the system accordingly.

The base portion 112 of the probe 14 has two coin-shaped portions 130 and 132 which are fastened together by screws 134. The scanner embodiment shown in FIGS. 2A and 2B is designed primarily for picking up particles off of a substantially flat surface. However, scanner probes of other shapes which are specifically designed to conform to non-flat sample surfaces could also be used. Coin-shaped portion 130 of the scanner base 112 is also referred to as a face plate, and is preferably made of a material which is impregnated with a friction limiting non-particulating substance, for example, hard black anodized aluminum with Teflon impregnation, type 3, class 2, mil spec A8625D. The scanner handle 116 has two bores 136 and 138 for receiving the supply and return tubes 16/18. Another hole 140 is provided in the handle 116 for receiving the electrical wiring 58 from the conduit.

The scanner base bottom side 114 is designed to interface with the sample surface. In this embodiment, the bottom side 114 has a hole 142 (i.e., a first opening) which is located approximately in the center of the base plate bottom side 114. The hole 142 is connected to the bore 136 in the scanner handle 116 which is connected to the return tube 18. Particles from the sample surface are sucked through the face plate hole 142 for the purpose of counting the particles in the particle counter main unit 10. The base plate bottom side 114 also has a plurality of smaller holes 144 (i.e., second openings) which converge into the scanner handle bore 138, which is connected to the air supply tube 16. Air is supplied from the main unit 10 and delivered through the face plate holes 144 onto the sample surface for dislodging and fluidizing particles so that they may be sucked through face plate hole 142 for counting. Face plate bottom side 114 also has intersecting grooves 146 for channeling dislodged particles into face plate hole 142.

The probe 14 can additionally include a light source, whereby pulsed light is directed at the surface to excite contaminant particles thereon at or near their resonant frequency, to thereby assist in detaching the particles from the test surface. The light source preferably can vary the pulse frequency and angle of incidence, and utilize the optical extraction mechanism described in U.S. Pat. Nos. 5,950,071 and 5,023,424, which are incorporated herein by reference.

The utilization of two detectors having different resolutions and two flow rates based upon a single sample airstream has many advantages. First, the high resolution detector 32 can be used to detect smaller particles, and the low resolution detector 34 can be used to detect larger particles, simultaneously, from a single sample airstream. Second, the controller 36 can monitor and control the relative flow rates going to the two detectors, and calculate the number of particles in the sample airstream based upon those relative flow rates and the detection results from the detectors. Third, a low flow detector (e.g. detector 32) can be used to detect small particles using a flow rate that is significantly lower that the flow rate needed to extract particles from the test surface and/or the flow rate provided by the probe.

Figure 3:
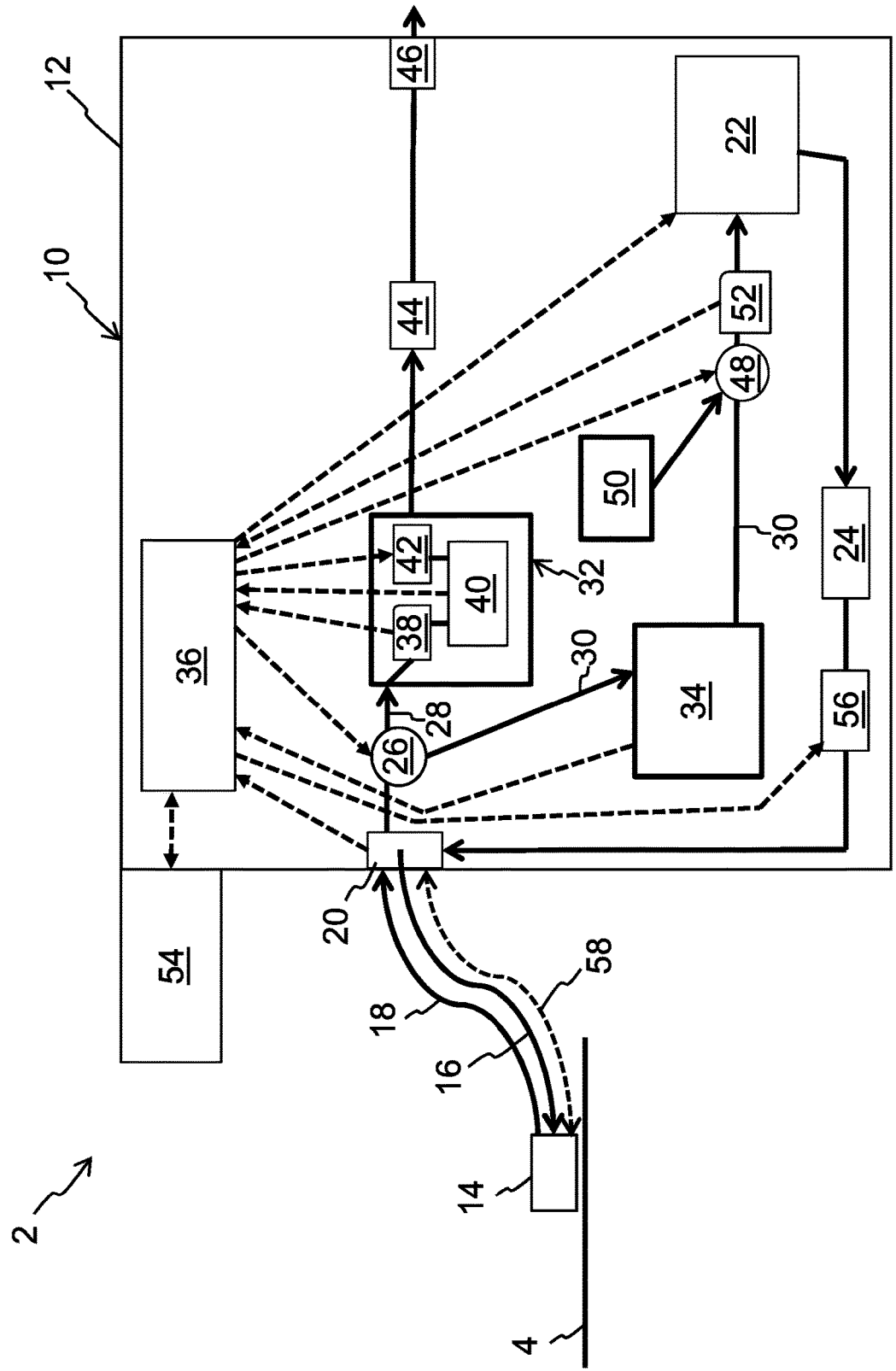
FIG. 3 is a diagram illustrating the components of a second embodiment of the particle detector system.

FIG. 3 illustrates a first alternate embodiment. The efficiency of these devices can be classified as the number of particles extracted from the sample surface and captured/counted by the device, divided by the total number of particles on the sample surface. In order for a particle to be extracted, the air flow across the sample surface created by the scanner probe must be sufficient to overcome the adhesion force between the particle and the sample surface. One known problem of conventional scanner probes, however, is that as the airflow rate is increased to attempt to better overcome the adhesion forces of more particles, more of the dislodged particles can be blown away from the scanner probe in which case they are never captured and counted by the device. This problem is called particle ejection, where particles dislodged by the scanner probe are ejected from the area under the scanner probe, where the particles cannot be captured and detected. Thus, merely increasing the velocity of airflow into the scanner probe can result in lower efficiency due to particle ejection, and therefore scanner probe efficiency cannot be fully maximized simply by increasing the velocity of the airflow.

It has been discovered by the present inventors that modulating the air flow rate of the supply air results in greater peak air velocities to dislodge more of the particles, yet also results in less particles that are lost by being blow out of and away from the scanner probe (i.e. lower particle ejection). It has also been discovered that the frequency of the air flow modulation affects the efficiency of the system. The frequency is preferably selected to maximize surface shear for particle displacement, to avoid (preferably exceed) the natural resonant frequency of scanner probe face to avoid particle generation by the scanner probe face, and to maximize particle dislodgement off the probed surface (also called "resuspension") by resonating the particles off of the surface (i.e., use an air flow frequency near or at the natural frequency of the particle).

Therefore, the embodiment of FIG. 3 includes a modulator 56 for modulating the supply air flow being sent to the probe 14. Specifically, while the average flow of the supply air is 1.1 CFM, the instantaneous air flow rate is pulsed, which improves Particle Efficiency PE (which is equal to the particles picked up and delivered to the detector divided by the total particles at the beginning of the test on the surface under the scanner probe). For example if there are ten particles on the surface 4 under the scanner probe 14, and normally six particles are picked up and transported in the return tube 18 to the detectors 32 and 34 using a constant flow rate, then the Particle Efficiency PE is 60%. With the modulated supply air flow, with the ten particles under the probe 14, particle ejection is minimized, meaning that two additional particles are captured instead of being ejected, and two more additional particles are dislodged and captured instead of staying on the probed surface, thus increasing Particle Efficiency PE to nine out of ten particles, or 90%. Modulating the air flow achieves both decreased ejection and increased energy to break the adhesion force for certain particles that would not overcome their adhesion force with constant air flow. The increased energy is accomplished through increasing air shear that can increase aerodynamic drag, which excites the particle to move by vibrating the particle close to its resonance frequency, and/or increasing the turbulence of the air flow over the particle to increase the chances or likelihood of resuspension. Thus, Particle Efficiency is improved by modulating the air flowing to the scanner probe, and thus across the scanner probe, to resonate or disturb the particles and overcome the adhesion force of the particle on the surface so it can be removed.

Modulator 56 can include any of the following configurations:

a) A temporary tank into which the air is pumped and then released, to increase peak air flow and overcome the adhesion force of the particle on the surface so it can be removed.

b) A piezo electric modulator to modulate the air flow. The modulation frequency is preferably set to avoid probe resonance and harmonics so the scanner probe does not vibrate on the surface and/or dampen the probe oscillation with a gasket (or o-ring) between the probe body and surface under test.

c) A valve to modulate the air to increase air shear and modulation.

The controller 36 can sweep the modulation frequency (e.g., from some low frequency to a higher frequency) to address the large array of particle sizes and materials (i.e., for dislodging particles having different resonant frequencies and/or adhesion forces). The electronic indicia discussed above preferably relays information about what probe is attached so the controller knows the resonance frequency of the particular attached probe attached and being used for the surface scanning.

It should be noted that air flow modulation across the scanned surface need not only be implemented by varying the amplitude of supply air flow to the scanner probe, but can further be implement by varying the amplitude of sample air flow (i.e., modulating the vacuum drawing air from the scanner probe and through the return tube 18). For example, this can be done by placing a modulator on the line between the interface 20 and the flow device 26. Modulating the amplitude of the vacuum can implemented by itself or in conjunction with the modulation of air supplied to the probe. If both the air flow and vacuum are modulated, they can be modulated in phase with each other, or out of phase with each other, to maximize PE.

Figure 4:
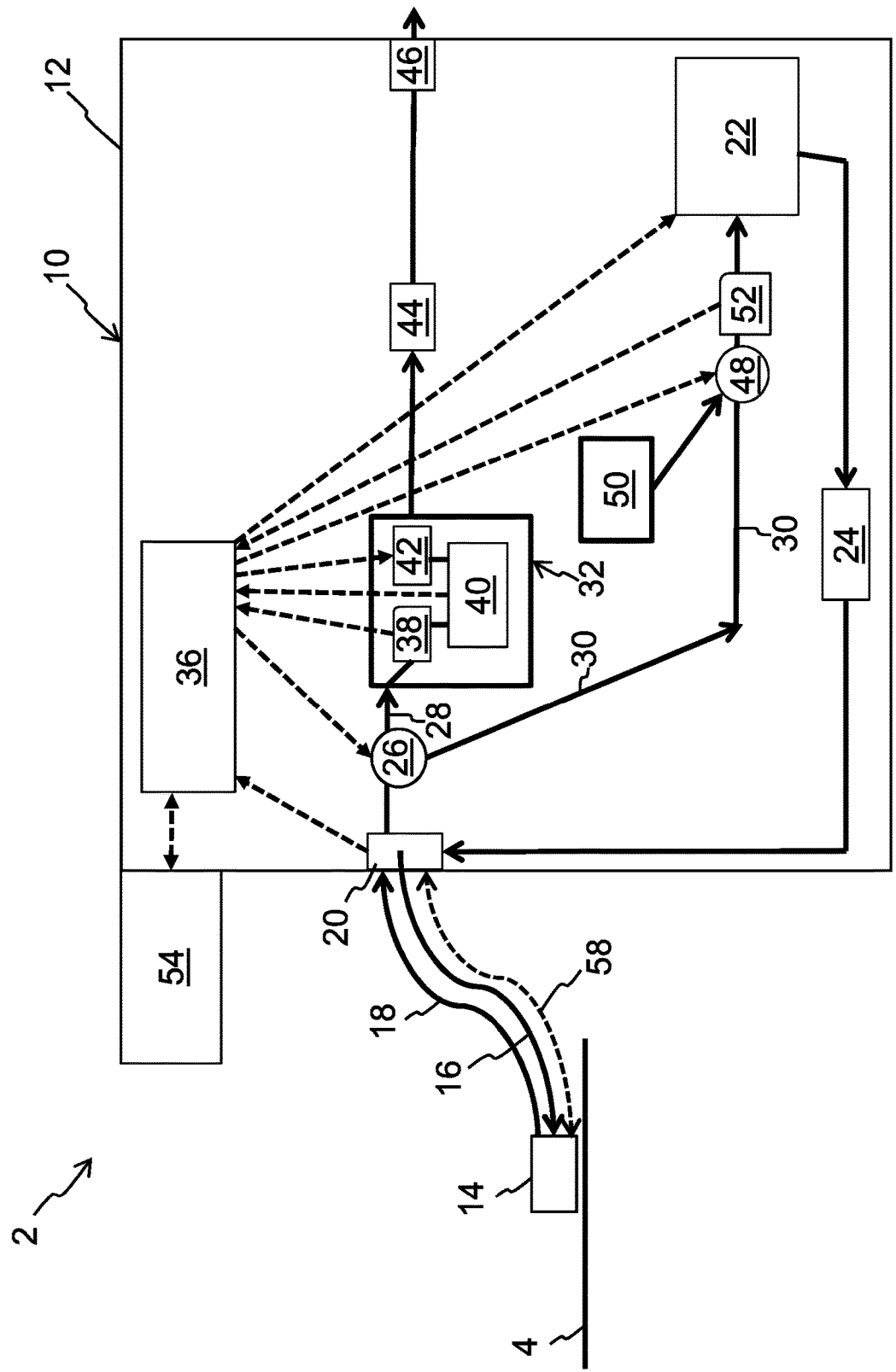
FIG. 4 is a diagram illustrating the components of a third embodiment of the particle detector system.

FIG. 4 illustrates another alternate embodiment, which is the same as that of FIG. 1 except the low resolution detector 34 is omitted. The 1.0 CFM airstream is provided directly to flow device 48. This configuration is ideal for applications in which only particles within the size range of the detector 32 need to be detected, and where the maximum flow rate of detector 32 is less than the operating flow rate of the probe 14. By providing the airstream of known flow rate that bypasses the detector 32, a low flow detector and high flow probe can be used together.

Figure 5:
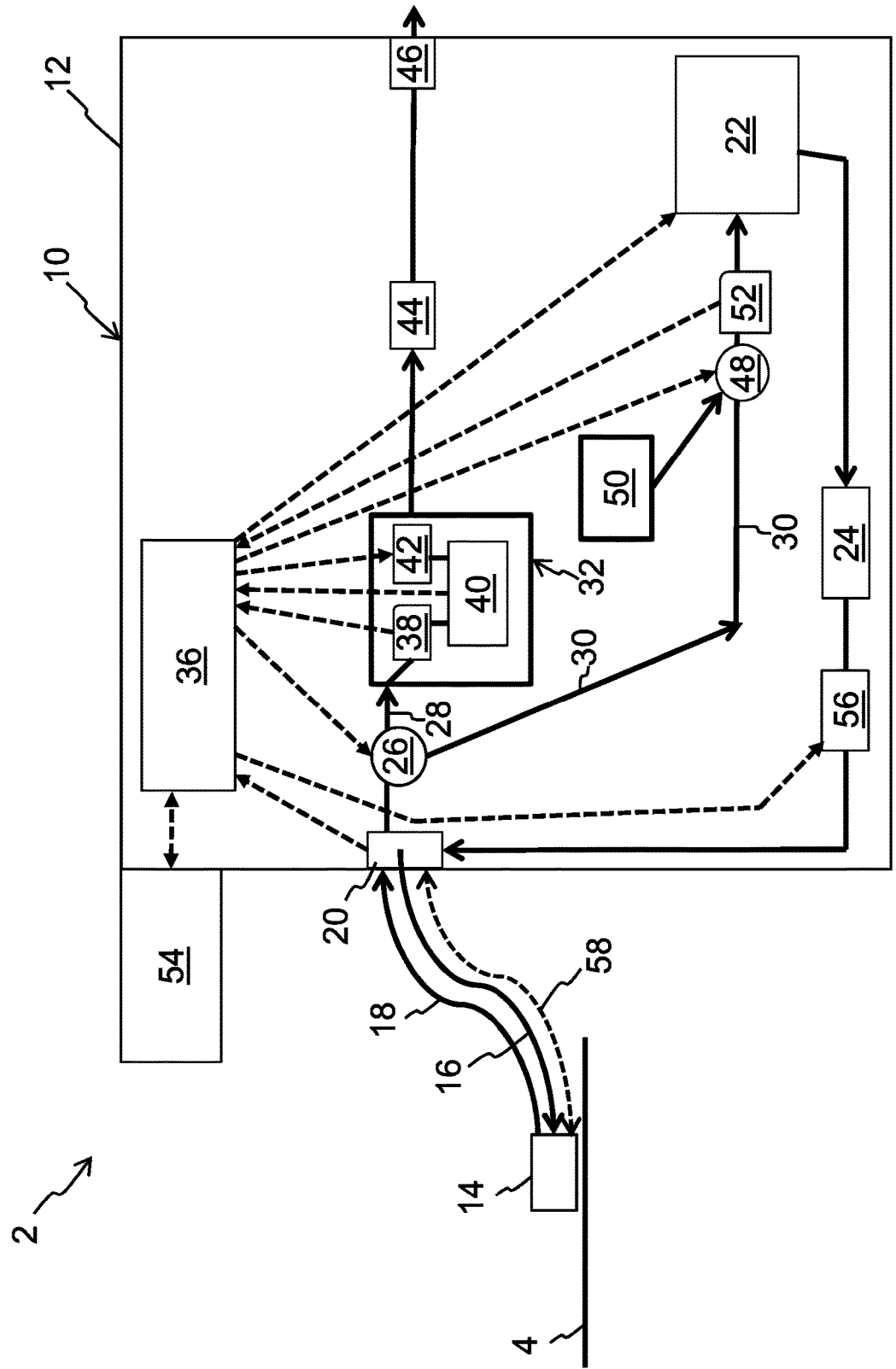
FIG. 5 is a diagram illustrating the components of a fourth embodiment of the particle detector system.

FIG. 5 illustrates yet one more alternate embodiment, which is the same as that of FIG. 4, but with the addition the modulator 56 described above with respect to the embodiment of FIG. 3.

It is to be understood that the present invention is not limited to the embodiment(s) described above and illustrated herein, but encompasses any and all variations falling within the scope of any claims. For example, references to the present invention herein are not intended to limit the scope of any claim or claim term, but instead merely make reference to one or more features that may be covered by one or more claims. Materials, processes and numerical examples described above are exemplary only, and should not be deemed to limit the claims. While the modulator 56 is shown inside the housing 12, it alternately could be provided outside the housing (e.g., along supply tube 16, inside the probe 14, along the return tube 18, etc.).

What is claimed is:

1. A device for counting particles on a sample surface, comprising:
   a scanner probe having a first opening for receiving particles from a sample surface and one or more second openings;
   one or more pumps for producing a first airstream flowing from the first opening and a second airstream flowing to the one or more second openings;
   a flow device for splitting the first airstream into a third airstream and a fourth airstream;
   a first particle detector for receiving and detecting particles in the third airstream, wherein the first particle detector is capable of detecting particles within a first range of particle sizes;
   a second particle detector for receiving and detecting particles in the fourth airstream, wherein the second particle detector is capable of detecting particles within a second range of particle sizes which is different from the first range of particle sizes;
   a control circuitry for controlling the flow device and the one or more pumps to provide a first flow rate of the third airstream and a second flow rate of the fourth airstream, wherein the first flow rate is smaller than the second flow rate;
   a first sensor for measuring the first flow rate; and
   a second sensor for measuring the second flow rate;
   wherein the control circuitry controls the flow device based on measured first and second flow rates by the first and second sensors.

2. The device of claim 1, further comprising:
   a second flow device for adding air from an air source to the fourth airstream to form the second airstream.

3. The device of claim 2, further comprising:
   a filter for filtering particles from the second airstream.

4. A device for counting particles on a sample surface, comprising:
   a scanner probe having a first opening for receiving particles from a sample surface and one or more second openings;
   one or more pumps for producing a first airstream flowing from the first opening and a second airstream flowing to the one or more second openings;
   a flow device for splitting the first airstream into a third airstream and a fourth airstream;
   a first particle detector for receiving and detecting particles in the third airstream, wherein the first particle detector is capable of detecting particles within a first range of particle sizes;
   a second particle detector for receiving and detecting particles in the fourth airstream, wherein the second particle detector is capable of detecting particles within a second range of particle sizes which is different from the first range of particle sizes;
   a control circuitry for controlling the flow device and the one or more pumps to provide a first flow rate of the third airstream and a second flow rate of the fourth airstream, wherein the first flow rate is smaller than the second flow rate;
   wherein the control circuitry determines a total particle count by:
      determining a corrected particle count for the first detector by multiplying a particle count from the first particle detector by a ratio of a third flow rate of the first airstream over the first flow rate;
      determining a corrected particle count for the second detector by multiplying a particle count from the second particle detector by a ratio of the third flow rate over the second flow rate; and adding the corrected particle count for the first detector and the corrected particle count for the second detector.

5. The device of claim 1, wherein the first and second particle detectors and the one or more pumps are disposed in a housing, and wherein the device further comprises:
a first tube extending between the housing and the scanner probe for conveying the first airstream; and
a second tube extending between the housing and the scanner probe for conveying the second airstream.

6. The device of claim 5, further comprising:
a modulator for modulating a flow rate of the second airstream.

7. The device of claim 6, wherein the modulator is disposed in the housing.

8. The device of claim 6, wherein the modulator is disposed in the scanner probe.

9. The device of claim 6, wherein the modulator modulates the flow rate of the second airstream at a fixed frequency.

10. The device of claim 6, wherein the modulator modulates the flow rate of the second airstream at a frequency that varies over time.

11. A device for counting particles on a sample surface, comprising:
a scanner probe having a first opening for receiving particles from a sample surface and one or more second openings;
one or more pumps for producing a first airstream flowing from the first opening and a second airstream flowing to the one or more second openings;
a flow device for splitting the first airstream into a third airstream and a fourth airstream;
a particle detector for receiving and detecting particles in the third airstream;
a control circuitry for controlling the flow device and the one or more pumps to provide a first flow rate of the third airstream and a second flow rate of the fourth airstream, wherein the first flow rate is smaller than the second flow rate;
a first sensor for measuring the first flow rate; and
a second sensor for measuring the second flow rate;
wherein the control circuitry controls the flow device based on measured first and second flow rates by the first and second sensors.

12. The device of claim 11, further comprising:
a second flow device for adding air from an air source to the fourth airstream to form the second airstream.

13. The device of claim 12, further comprising:
a filter for filtering particles from the second airstream.

14. The device of claim 11, wherein the particle detector and the one or more pumps are disposed in a housing, and wherein the device further comprises:
a first tube extending between the housing and the scanner probe for conveying the first airstream; and
a second tube extending between the housing and the scanner probe for conveying the second airstream.

15. The device of claim 14, further comprising:
a modulator for modulating a flow rate of the second airstream.

16. The device of claim 15, wherein the modulator is disposed in the housing.

17. The device of claim 15, wherein the modulator is disposed in the scanner probe.

18. The device of claim 15, wherein the modulator modulates the flow rate of the second airstream at a fixed frequency.

19. The device of claim 15, wherein the modulator modulates the flow rate of the second airstream at a frequency that varies over time.

* * * * *